United States Patent
Ai et al.

(10) Patent No.: US 8,142,608 B2
(45) Date of Patent: Mar. 27, 2012

(54) ATMOSPHERIC PRESSURE PLASMA REACTOR

(75) Inventors: Chi-fong Ai, Taoyuan County (TW); Mien-Win Wu, Taoyuan County (TW); Cheng-Chang Hsieh, Chiayi (TW)

(73) Assignee: Atomic Energy Council—Institute of Nuclear Energy Research, Taoyuan (TW)

( * ) Notice: Subject to any disclaimer, the term of this patent is extended or adjusted under 35 U.S.C. 154(b) by 435 days.

(21) Appl. No.: 11/898,356

(22) Filed: Sep. 11, 2007

(65) Prior Publication Data

US 2010/0218896 A1    Sep. 2, 2010

(51) Int. Cl.
*H01L 21/00*    (2006.01)
*C23C 16/00*    (2006.01)

(52) U.S. Cl. .......... 156/345.43; 156/345.47; 118/723 E

(58) Field of Classification Search ............... 118/723 E; 156/345.43, 345.44, 345.45, 345.46, 345.47
See application file for complete search history.

(56) References Cited

U.S. PATENT DOCUMENTS

| | | | | |
|---|---|---|---|---|
| 5,578,130 A | * | 11/1996 | Hayashi et al. | 118/723 E |
| 5,753,886 A | * | 5/1998 | Iwamura et al. | 219/121.43 |
| 6,441,554 B1 | * | 8/2002 | Nam et al. | 315/111.21 |
| 2005/0001527 A1 | * | 1/2005 | Sugiyama | 313/231.31 |
| 2006/0042545 A1 | * | 3/2006 | Shibata et al. | 118/722 |
| 2006/0189168 A1 | * | 8/2006 | Sato et al. | 438/795 |
| 2008/0060579 A1 | * | 3/2008 | Hsieh et al. | 118/715 |

FOREIGN PATENT DOCUMENTS

JP    2002018276 A  *  1/2002

* cited by examiner

*Primary Examiner* — Ram Kackar
*Assistant Examiner* — Anna Crowell
(74) *Attorney, Agent, or Firm* — Jackson IPG PLLC; Demian K. Jackson

(57) ABSTRACT

An atmospheric pressure plasma reactor includes a high-voltage electrode, a common grounded electrode, a bias electrode and at least one dielectric layer. The high-voltage electrode is connected to a high-voltage power supply. The common grounded electrode is used with the high-voltage electrode to discharge and therefore produce planar atmospheric plasma from reactive gas. The bias electrode is used to generate bias for attracting the ions of the planar atmospheric pressure plasma. The dielectric layer is used to suppress undesirable arc discharge during the discharging.

3 Claims, 5 Drawing Sheets

ATMOSPHERIC PRESSURE PLASMA REACTOR

BACKGROUND OF INVENTION

1. Field of Invention

The present invention relates to an atmospheric pressure plasma reactor for the surface modification of materials and, more particularly, to an atmospheric pressure plasma reactor employing two power supplies for enhancing the surface properties of materials.

2. Related Prior Art

Plasma is quasi-neutral gas consisting of ions, electrons, neutral atoms, excited atoms and various free radicals. Compared with typical chemical or other processing methods, plasma treatment is energy-economic, fast, material-economic and environmentally friendly due to its high energy and high activities. Hence, plasma modifications are widely used for manufacturing various products in industry and commercial applications. Accordingly, various low-pressure plasma reactors such as those based on direct current capacitor discharge, radio frequency capacitor discharge, inductively coupled plasma, electron cyclotron resonance, magnetron sputtering and cathode arc have been proposed.

A dielectric barrier discharge plasma reactor includes at least one dielectric barrier inserted between two discharging electrodes drived by alternating current or pulsed high voltage power supplies such as those disclosed in U.S. Pat. Nos. 5,387,842 and 5,414,324. Nevertheless, as a substrate is located in the discharging zone of the plasma reactor, some problems have been encountered in operating the plasma reactor.

Firstly, the substrate could easily be damaged because of the charged particle bombardments in the plasma reactor.

Secondly, the energy of positive ions is not controllable.

Thirdly, the discharging is not uniform in the plasma reactor due to the interferences between substrate and plasma.

Fourthly, the surface of the substrate might be damaged or unevenly processed in filamentary discharge.

Fifthly, adjustable parameters in the plasma operation are rather limited.

The present invention is therefore intended to obviate or at least alleviate the problems encountered in prior art.

SUMMARY OF INVENTION

It is the primary objective of the present invention to provide an atmospheric pressure plasma reactor that minimizes the damage of substrates by the control of the ion energy or the uncharged active free radicals in the afterglow plasma stream via the combination of two high voltage sources for a pair of parallel electrodes and a bias electrode, so as to achieve better results for surface activation, cleaning and depositions.

It is another objective of the present invention to provide an atmospheric pressure plasma reactor that controls the energy of ions.

It is another objective of the present invention to provide an atmospheric pressure plasma reactor that provides uniform discharge.

It is another objective of the present invention to provide an atmospheric pressure plasma reactor that is capable to accomplish better results for surface activation, cleaning and depositions.

To achieve the foregoing objectives of the present invention, an atmospheric pressure plasma reactor includes a high-voltage electrode, a common grounded electrode, a bias electrode and at least one dielectric layer as shown in FIG. 1. The high-voltage electrode is connected to a high-voltage power supply. The common grounded electrode is used in conjunction with the high-voltage electrode to for discharging and a planar atmospheric plasma is produced via the flow of various reactive gases in the electrodes. The bias electrode is used to generate bias for attracting the ions of the planar atmospheric pressure plasma. The dielectric layer is used to suppress undesirable arc discharge during the discharging.

Other objectives, advantages and features of the present invention will become apparent from the following description referring to the attached drawings.

BRIEF DESCRIPTION OF DRAWINGS

The present invention will be described via the detailed illustration of four embodiments referring to the drawings.

DETAILED DESCRIPTION OF EMBODIMENTS

Figure 1:
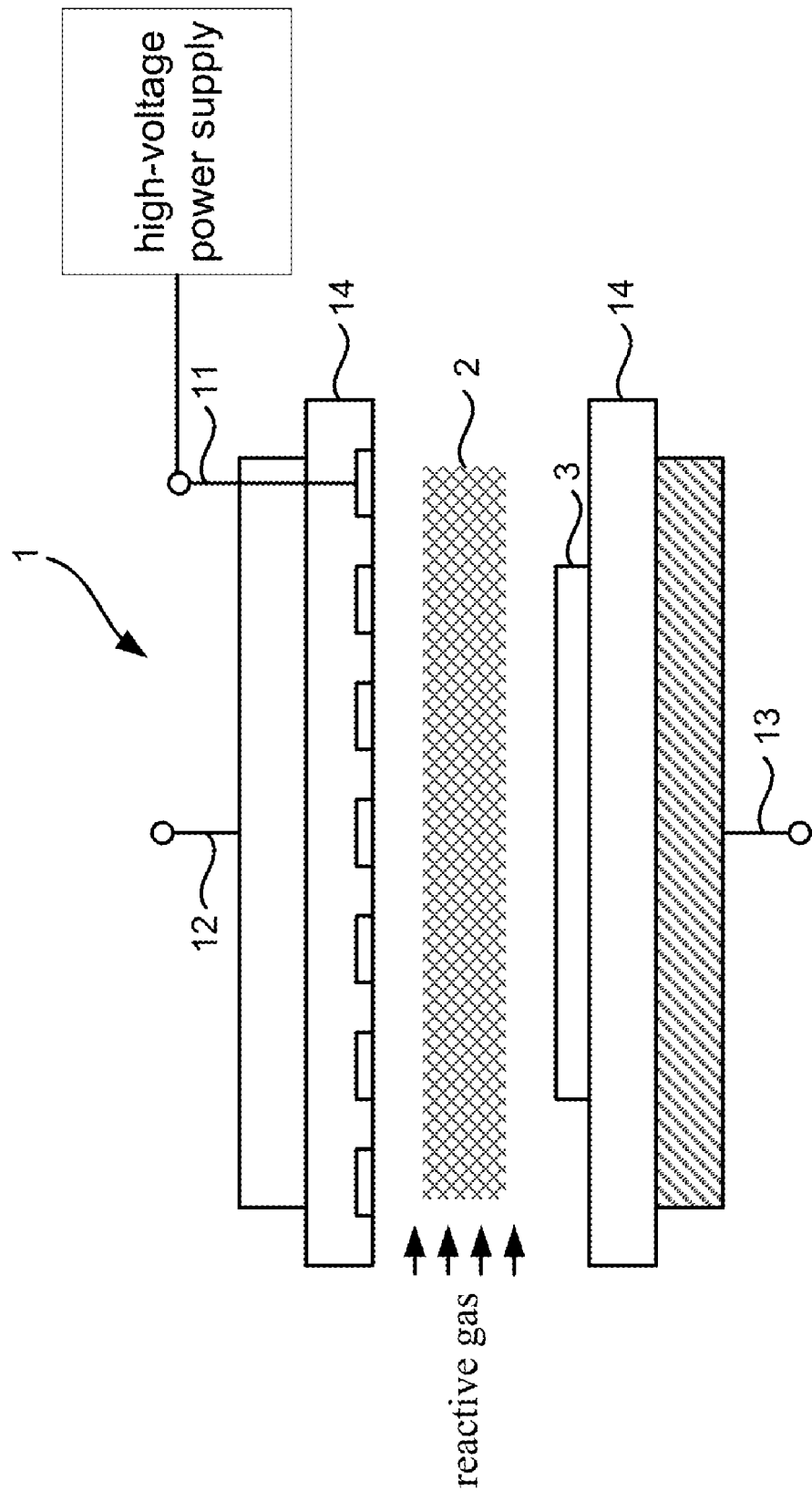
FIG. 1 is a side view of an atmospheric pressure plasma reactor according to the first embodiment of the present invention.

Referring to FIG. 1, there is shown an atmospheric pressure plasma reactor 1 according to a first embodiment of the present invention.

Figure 2:
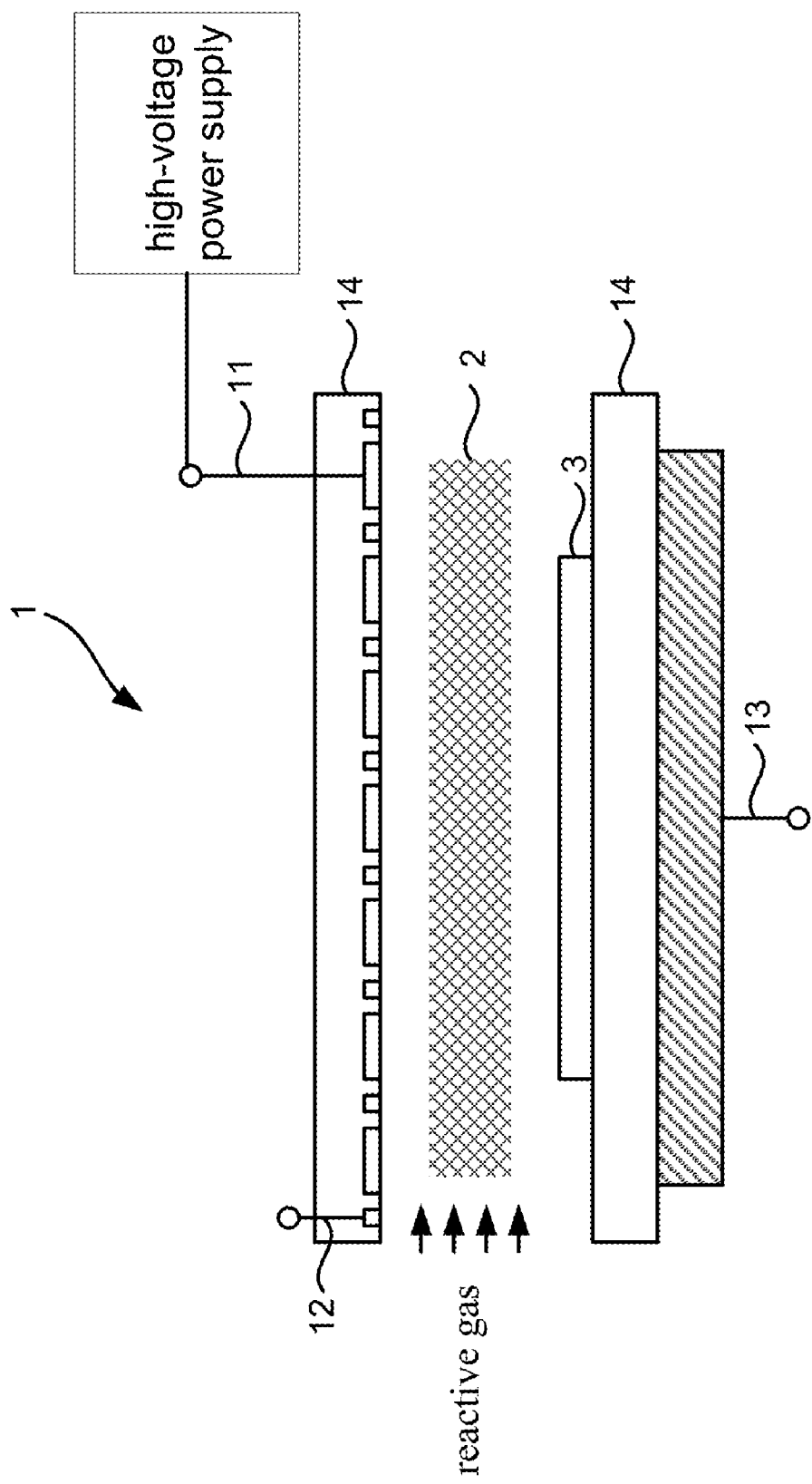
FIG. 2 is a side view of an atmospheric pressure plasma reactor according to the second embodiment of the present invention.

Referring to FIG. 2, there is shown an atmospheric pressure plasma reactor 1 according to a second embodiment of the present invention.

According to both of the first and second embodiments of the present invention, the atmospheric pressure plasma reactor 1 includes at least one high-voltage electrode 11, a common grounded electrode 12, a bias electrode 13 and two dielectric layers 14. The bias electrode 13 is used to control(s) the energy of ion bombardment, to improve and enhance the surface properties of the treated substrates in activation, cleaning and depositions by minimizing the surface damage and to speed up the treatment processes.

The high-voltage electrode 11 is electrically connected to an AC, pulsed or RF high-voltage power supply.

The common grounded electrode 12 is electrically connected to the ground. The common grounded electrode 12 and the high-voltage electrode 11 together generate planar atmospheric pressure plasma 2 in a plasma chamber.

The bias electrode 13 is electrically connected to a bias power supply to generate bias. The bias electrode 13 attracts the ions of the planar atmospheric pressure plasma 2 in a discharge gap defined between the dielectric layers 14 in the plasma chamber.

The dielectric layers 14 suppress undesirable arc discharge during the discharging.

In operation, a substrate 3 is disposed in the plasma chamber. The material of the substrates 3 may be metal, polymer, glass or ceramic. The plasma chamber is equipped with the connection leads for the high-voltage power supply, the bias power supply and the ground. The high-voltage power supply is electrically connected to the high-voltage electrode 11. The ground is electrically connected to the common grounded electrode 12. Reactive gas is provided to the gap space between high-voltage electrode 11 and the common grounded electrode 12. Via the dielectric layers 14, the high-voltage electrode 11 and the common grounded electrode 12 together generate the planar atmospheric pressure plasma 2 in a plasma chamber.

At this instant, the bias power supply is electrically connected to the bias electrode 13. The bias electrode 13 generates bias and attracts the ions of the planar atmospheric pressure plasma 2. By adjusting the amplitude of the bias voltage, the energy of the ions bombarding on the substrate 3 can be controlled.

Figure 3:
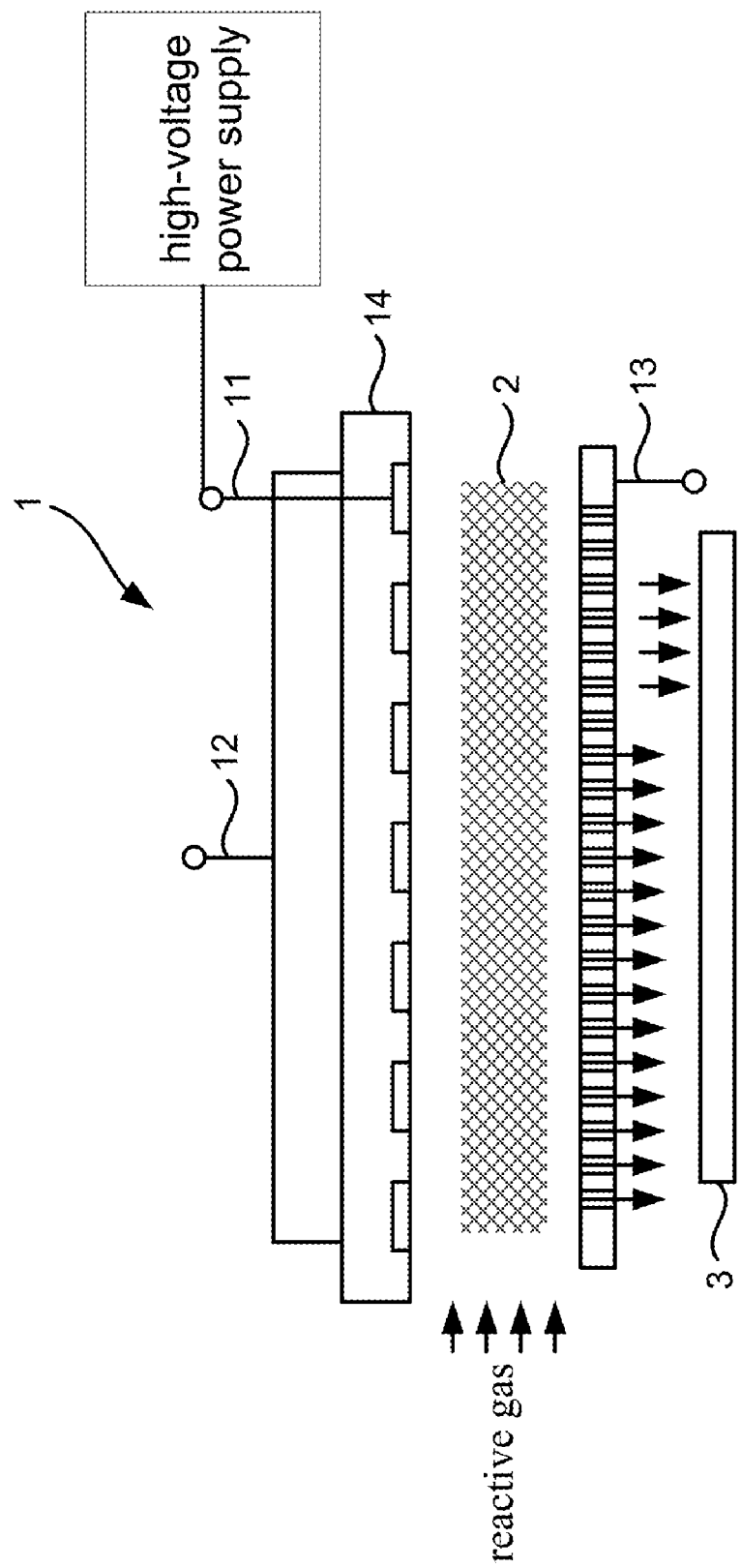
FIG. 3 is a side view of an atmospheric pressure plasma reactor according to the third embodiment of the present invention.
Figure 4:
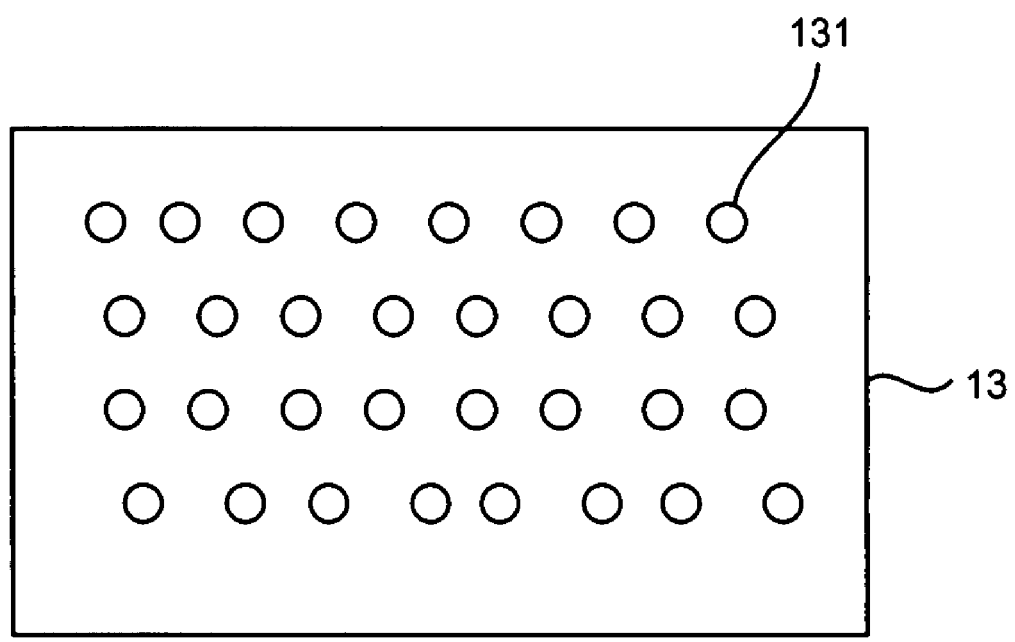
FIG. 4 is a top view of a bias electrode for use in an atmospheric pressure plasma reactor according to the present invention.

Referring to FIGS. 3 and 4, there is shown a diffusion-type plasma reactor 1 according to a third embodiment of the present invention. The third embodiment is like the first and second embodiments except two things. Firstly, there is only one dielectric layer 14. Secondly, the bias electrode 13 includes a plurality of apertures 131 defined therein. In this plasma reactor, the ions, neutral free radicals and other reactive species move through the apertures 131 via bombarding one another onto the surface of the substrate 3 for surface processing or coating on single side. Therefore, the atmospheric pressure plasma reactor 1 not only minimizes the damage of the surface of the substrate 3 but also achieve the same functions for surface activation, cleaning and depositions.

Figure 5:
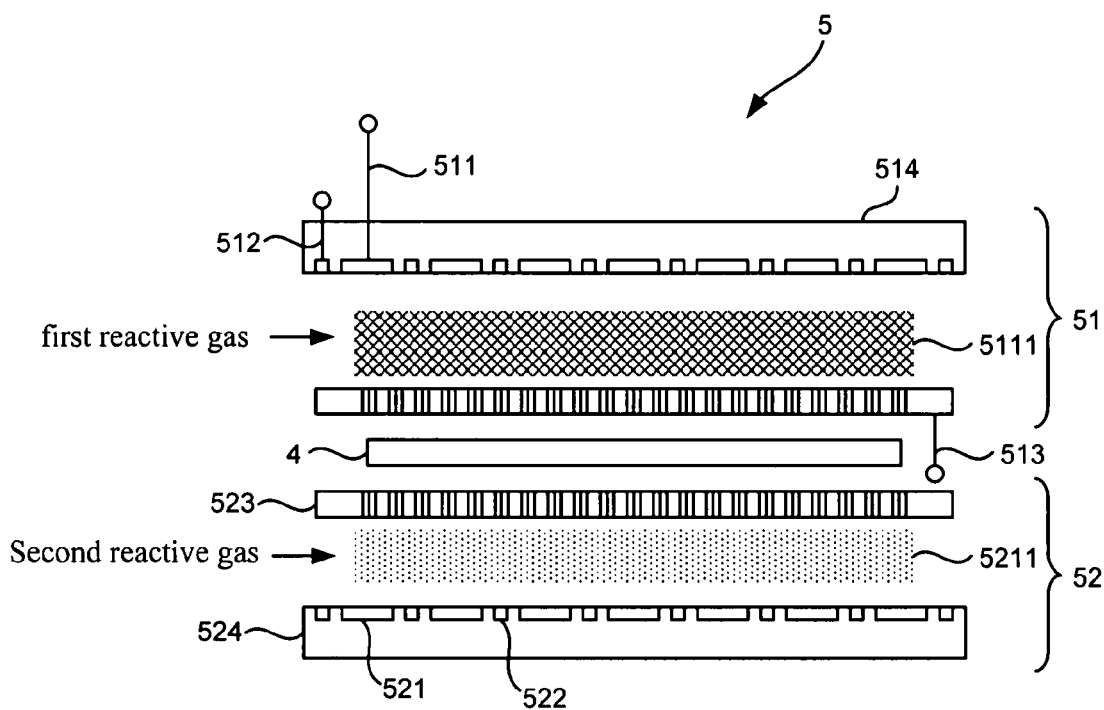
FIG. 5 is a side view of an atmospheric pressure plasma reactor according to the fourth embodiment of the present invention.

Referring to FIG. 5, there is shown an atmospheric pressure plasma reactor 5 according to a fourth embodiment of the present invention. The atmospheric pressure plasma 5 includes a first unit 51 and a second unit 52. The first and second units 51 and 52 are like the diffusion-type plasma reactor 1 according to the third embodiment of the present invention. The first unit 51 includes a high-voltage electrode 511, a common grounded electrode 512, a bias electrode 513 and a dielectric layer 514. The second unit 52 includes a high-voltage electrode 521, a common grounded electrode 522, a bias electrode 523 and a dielectric layer 524.

In operation, first reactive gas is provided between the dielectric layer 514 and the bias electrode 513. First planar atmospheric pressure plasma 5111 is produced from the first reactive gas. Second reactive gas is provided between the dielectric layer 524 and the bias electrode 523. Second planar atmospheric pressure plasma 5211 is produced from the second reactive gas. A piece of work 4 is located between the bias electrodes 513 and 523. The bias electrode 513 attracts the ions of the first planar atmospheric pressure plasma 5111 so that they go through the apertures of the bias electrode 513 onto a first surface of the substrate 4. The bias electrode 523 attracts the ions of the second planar atmospheric pressure plasma 5211 so that they go through the apertures of the bias electrode 523 onto a second surface of the substrate 4. Thus, the first and second surfaces of the substrate 4 are processed at the same time. The bias electrodes 513 and 523 are preferred; however, they can be omitted in another embodiment.

The atmospheric pressure plasma reactor according to the present invention exhibits several advantages over the prior art.

Firstly, the damage of the substrate caused by ion bombardment is minimized.

Secondly, the energy of ions is controllable.

Thirdly, the discharging plasma is uniform since the discharge in the plasma reactor is not interfered by the presence of the substrate.

Fourthly, the surface of the substrate is activated, cleaned and coated by using free radicals.

Fifthly, a lots of operation parameters can be adjusted to meet various requirements of different substrates.

The present invention has been described via the detailed illustration of the embodiments. Those skilled in the art can derive variations from the embodiments without departing from the scope of the present invention. Therefore, the embodiments shall not limit the scope of the present invention defined in the claims.

The invention claimed is:

1. An atmospheric pressure plasma reactor comprising:
    a planar high-voltage electrode connected to a high-voltage power supply;
    a planar common grounded electrode coplanar with the planar high-voltage electrode to discharge and therefore produce planar atmospheric plasma from reactive gas;
    a planar bias electrode parallel with the planar high-voltage and common grounded electrodes for instantly generating bias to attract the ions of the planar atmospheric pressure plasma upon formation of the planar atmospheric pressure plasma; and
    at least one dielectric layer for suppressing undesirable arc discharge during the discharging and wherein said planar high-voltage electrode and said planar common grounded electrode are embedded within said dielectric layer.

2. The atmospheric pressure plasma reactor according to claim 1 comprising two dielectric layers between which a substrate is located in operation.

3. The atmospheric pressure plasma reactor according to claim 1, wherein the bias electrode comprises a plurality of apertures defined therein, and the reactive gas is located on a side of the bias electrode while a substrate is located on an opposite side of the bias electrode in operation.

* * * * *